United States Patent [19]
Shimada et al.

[11] Patent Number: 6,090,468
[45] Date of Patent: Jul. 18, 2000

[54] MULTILAYER WIRING BOARD FOR MOUNTING SEMICONDUCTOR DEVICE AND METHOD OF PRODUCING THE SAME

[75] Inventors: Yasushi Shimada, Tsukuba; Yasushi Kumashiro; Teiichi Inada, both of Shimodate; Kazunori Yamamoto, Tsukuba, all of Japan

[73] Assignee: Hitachi Chemical Company, Ltd., Tokyo, Japan

[21] Appl. No.: 08/925,440

[22] Filed: Sep. 9, 1997

[30]   Foreign Application Priority Data

Sep. 10, 1996  [JP]  Japan ..................................... 8-238696
May 28, 1997  [JP]  Japan ..................................... 9-138015

[51] Int. Cl.⁷ ................................. H05K 1/02; C09J 4/00
[52] U.S. Cl. .......................... 428/137; 428/138; 428/131; 428/901; 428/414; 428/212; 156/300; 156/311; 156/312; 156/330; 29/825; 174/259; 361/757; 361/761; 361/739
[58] Field of Search ..................................... 428/138, 901, 428/414, 131, 137, 212; 156/300, 311, 312, 330; 29/825; 174/259; 361/757, 761, 739

[56]   References Cited

U.S. PATENT DOCUMENTS

| | | | |
|---|---|---|---|
| 4,680,075 | 7/1987 | McNeal, et al. | 156/289 |
| 4,980,410 | 12/1990 | Fryd et al. | 524/510 |
| 5,162,439 | 11/1992 | Tsuji | 525/113 |
| 5,194,326 | 3/1993 | Arthur, et al. | 428/325 |
| 5,233,133 | 8/1993 | Iwasaki et al. | 174/250 |
| 5,278,259 | 1/1994 | Futakuchi et al. | 525/482 |
| 5,323,534 | 6/1994 | Iwasaki et al. | 29/850 |
| 5,466,535 | 11/1995 | Higgins et al. | 428/483 |
| 5,476,690 | 12/1995 | Ohta et al. | 427/510 |
| 5,690,837 | 11/1997 | Nakaso et al. | 216/17 |
| 5,766,386 | 6/1998 | Sakai et al. | 156/62.2 |

FOREIGN PATENT DOCUMENTS

| | | |
|---|---|---|
| 0412323A2 | 2/1991 | European Pat. Off. . |
| 0552984A2 | 7/1993 | European Pat. Off. . |
| 0819747 | 10/1996 | European Pat. Off. . |
| WO96/31574 | 10/1996 | WIPO . |

OTHER PUBLICATIONS

Patent Abstracts of Japan, Publication No. 08008354, Publication Date–Jan. 12, 1996.
Patent Abstracts of Japan, Publication No. 06260533, Publication Date–Sep. 16, 1994.
Patent Abstracts of Japan, Publication No. 63311747, Publication Date–Dec. 20, 1988.

*Primary Examiner*—William P. Watkins, III
*Attorney, Agent, or Firm*—Atonelli, Terry, Stout & Kraus, LLP

[57]   ABSTRACT

A multilayer wiring board for mounting a semiconductor device, which has a multi-bonding-deck cavity, comprises at least two wiring boards and an insulation adhesive layer having an elastic modulus of 1,400 MPa or lower having a coefficient of thermal expansion of 450 ppm/° C. or lower in a direction of thickness and being a cured product of an adhesive film which is a semi-cured product of an adhesive composition comprising (a) 71 to 100 parts by weight of an epoxy group-containing acrylic rubber having a glass transition point of –10° C. or above and a weight average molecular weight of 100,000 or above, (b) 50 to 70 parts by weight of an epoxy resin having a weight average molecular. weight of less than 10,000 and a curing agent, (c) 10 to 60 parts by weight of a high-molecular weight resin being compatible with the epoxy resin and having a weight average molecular weight of 30,000 or above and (d) 0.1 to 5 parts by weight of a cure accelerator.

18 Claims, 4 Drawing Sheets

2.54mm 1.27mm

MULTILAYER WIRING BOARD FOR MOUNTING SEMICONDUCTOR DEVICE AND METHOD OF PRODUCING THE SAME

BACKGROUND OF THE INVENTION (a) Field of the Invention

The present invention relates to a multilayer wiring board for mounting a semiconductor device, particularly a multilayer wiring board which has a multi-bonding-deck cavity (multi-pad-level cavity) for housing a semiconductor device and connecting the semiconductor device with interconnect leads, and is used for mounting semiconductor devices. The present invention further relates to a method of producing the multilayer wiring board for mounting a semiconductor device.

(b) Description of the Related Art

With the recent advance of electronic instruments, the requirements of wiring boards for high density wiring has become increasingly strict. Particularly, in multilayer wiring boards used in semiconductor packages of pin grid array (PGA) type, ball grid array (BGA) type, etc., the increase of output signal wires has been accompanied by an increase of the number of wire bonding pads for making connection with semiconductor devices. This requires complicated shape-processing, such as formation of multi-bonding-deck cavities.

Examples of bonding materials which has been used for multi-layering the wiring boards for mounting semiconductor having multi-bonding-deck cavities, include prepregs reinforced by glass fiber, polyimide resin adhesives, epoxy resin adhesives and rubber-epoxy resin adhesives.

When the prepregs are used for the production of wiring boards requiring complicated shape-processing, such as formation of cavities, resin powder is scattered on machining for cutting out cavity portions and adheres to wire bonding pads at the time of lamination, to cause occasional connection errors in wire bonding process.

Further, when prepregs are used, there arises difficulty in controlling the flowability of resins during lamination with heat and pressure. Resins of high flowability increase exudation into cavities to coat wire bonding pads with the exudate and increase connection errors. Resins of low flowability reduce exudation into cavities, but tend to form voids around internal circuit conductors to deteriorate insulation reliability. Therefore, the use of prepregs has the disadvantage of low production efficiency due to low yield. To solve these problems, such as low processability, there has recently occurred increasing demands to use as interlaminar adhesive films which do not contain woven or non-woven cloth reinforcing materials and is easy to control flowability and generates no cutting chips or powder.

However, it is not that any adhesive film can be used for the production of multilayer wiring boards. Due to the larger content of high-molecular weight resins as compared with prepregs, adhesive films make it easy to control the flow of resins at the time of lamination with heat and pressure, namely to reduce the exudation of resins into cavities and to prevent the formation of voids at the sides of patterned copper foil which forms internal circuits. However, to ensure industrially stable yield, it is necessary to understand the relationship between the physical properties and processability of adhesive films, and there are demands for adhesive films suitable for production facilities and means of controlling their physical properties.

None of the adhesive films of prior art have a processability enough for formation of complicated structures, particularly such a stable processability as not to cause scatter in the amount of resin exudation into cavities during lamination with heat and pressure.

When polyimide or epoxy resin adhesives are used as adhesive films in the production of the recent multilayer wiring boards of high wiring density, it is impossible to improve soldering heat resistance and moisture resistance to a degree sufficient for practical uses.

Also, multilayer wiring boards which are produced by using the rubber-epoxy resin adhesives conventionally used in flexible wiring boards are poor not only in soldering heat resistance and moisture resistance, but also in connection reliability, and are inapplicable for practical uses.

SUMMARY OF THE INVENTION

An object of the present invention is to provide a multilayer wiring board for mounting semiconductor devices which has a multi-bonding-deck cavity, is produced by using an adhesive film having excellent processability and is excellent in heat resistance and connection reliability.

Another object of the present invention is to provide a method of producing a multilayer wiring board for mounting semiconductor devices which has a multi-bonding-deck cavity, which method prevents scatter in the amount of resin exudation into cavities at the time of lamination with heat and pressure.

That is, the present invention provides a multilayer wiring board for mounting a semiconductor device, which has a multi-bonding-deck cavity for housing a semiconductor device and comprises at least two wiring boards each having at least one wiring surface and a cavity, the cavity of one wiring board being larger in size of circumference than the cavity of the other wiring board, the wiring boards being put in layers, with a circumference of the cavity of one wiring board being exterior to a circumference of the cavity of the other wiring board, and bonded to each other with an insulation adhesive layer, the insulation adhesive layer having an elastic modulus of 1,400 MPa or lower as measured at 25° C., having a coefficient of thermal expansion of 450 ppm/° C. or lower in a direction of thickness and being a cured product of a semi-cured product of an adhesive composition, the adhesive composition comprising (a) 71 to 100 parts by weight of an epoxy group-containing acrylic rubber which is a copolymerization product of 18 to 40% by weight of acrylonitrile, 2 to 6% by weight of glycidyl acrylate, glycidyl methacrylate or a mixture thereof as a functional group-containing monomer and balance of at least one selected from the group consisting of ethyl acrylate, ethyl methacrylate, butyl acrylate and butyl methacrylate, and has a glass transition point of −10° C. or above and a weight average molecular weight of 100,000 or above, (b) 50 to 70 parts by weight of a combination of an epoxy resin having a weight average molecular weight of less than 10,000 and a curing agent, (c) 10 to 60 parts by weight of a high-molecular weight resin being compatible with the epoxy resin and having a weight average molecular weight of 30,000 or above and (d) 0.1 to 5 parts by weight of a cure accelerator.

The present invention further provides a method of producing a multilayer wiring board which is for mounting a semiconductor device and has a multi-bonding-deck cavity, which method comprises forming a laminate composite by putting in layers at least a first wiring board and a second wiring board each having at least one wiring surface and a cavity, the cavity of the first wiring board being larger in size of circumference than the cavity of the second wiring board, with an adhesive film, which has a cavity being identical in size and shape of circumference with the cavity of the first wiring board, disposed between the two wiring boards, so that the circumference of the cavity of the first wiring board is located exterior to the circumference of the cavity of the second wiring board and is located just on the circumference of the cavity of the adhesive film, and bonding the laminate composite with heat and pressure.

DESCRIPTION OF THE PREFERRED EMBODIMENT

Figure 1:
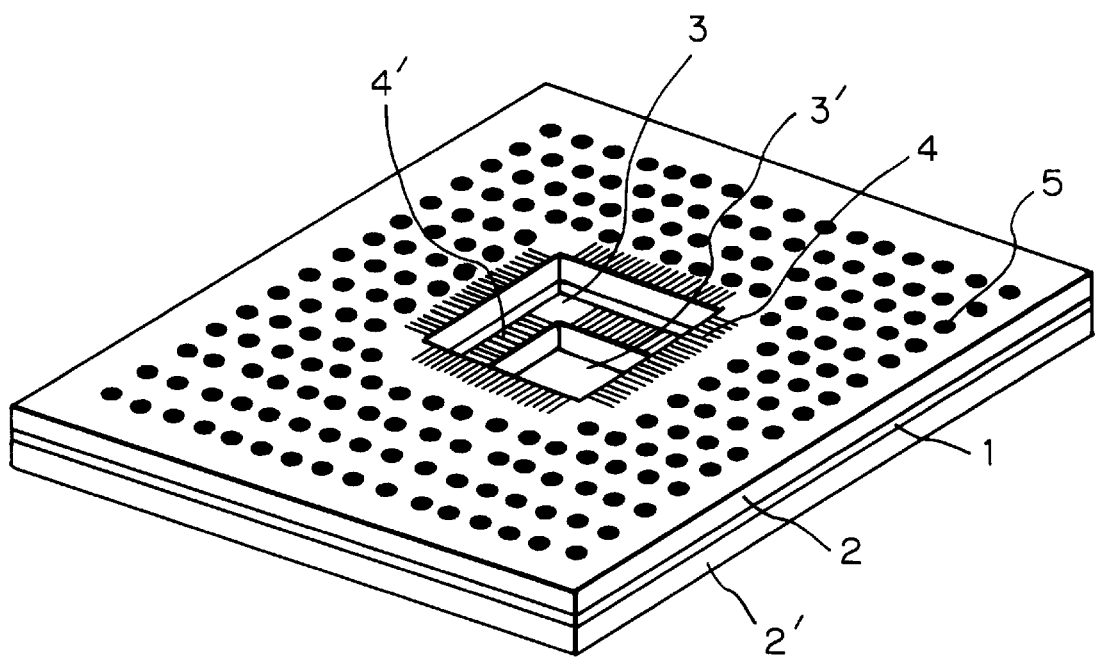
FIG. 1 is a perspective view of a multilayer wiring board for mounting a semiconductor device of an embodiment according to the present invention.

FIG. 1 shows a perspective view of a multilayer wiring board for mounting semiconductor devices which is an embodiment according to the present invention. The multilayer wiring board comprises two wiring boards 2 (first wiring board) and 2' (second wiring board) and an insulation adhesive layer 1 bonding the wiring boards 2 and 2'. Each wiring board has at least one wiring surface bearing circuit-patterned conductor. The wiring board 2 and 2', respectively, have a cavity 3 and a cavity 3', and wire bonding pads 4 and 4' are arranged, respectively, around the cavities 3 and 3'. FIG. 1 shows only the wire bonding pads and connection terminals 5, and conductor lines connecting the leads in the wire bonding pads with the connection terminals are not shown. The circuit patterns and cavities are formed previous to lamination and bonding of the wiring boards. The circumference of the cavity 3 of the wiring board 2 is larger than and exterior to the circumference of the cavity 3' of the wiring board 2', so that a multi-bonding-deck cavity (multi-pad-level cavity) is formed. The multi-bonding-deck cavity as shown in FIG. 1 is a two-deck cavity which has wire bonding pads 4 and 4' on two levels, respectively.

The insulation adhesive layer 1 is a cured product of an adhesive film, and has an elastic modulus of 1,400 MPa or lower as measured at 25° C. and a coefficient of thermal expansion of 450 ppm/° C. or lower in a direction of thickness. The adhesive film is a semi-cured product of an adhesive composition comprising the above-described components (a) to (d).

Component (a)

The epoxy group-containing acrylic rubber to be used in the present invention is a copolymerization product of 18 to 40% by weight of acrylonitrile, 2 to 6% by weight of glycidyl acrylate, glycidyl methacrylate or a mixture thereof as a functional group-containing monomer and balance of at least one selected from the group consisting of ethyl acrylate, ethyl methacrylate, butyl acrylate and butyl methacrylate.

The content of copolymerized acrylonitrile in the copolymer is 18 to 40% by weight. Copolymers containing less than 18% by weight of copolymerized acrylonitrile may be so poor in solvent resistance as to be susceptible to solvents used in the processes following to lamination. Those containing more than 40% by weight of copolymerized acrylonitrile may be poor in compatibility with other components or may be difficult to copolymerize.

The epoxy group-containing acrylic rubber has a weight average molecular weight (measured by GPC, polystyrene conversion) of 100,000 or above, preferably 800,000 or above. The epoxy group-containing acrylic rubbers having a molecular weight within this range do not decrease the strength and flexibility of adhesive film nor increase the tackiness of the adhesive film, and prevent excessive increase of flowability which makes the control of exudation difficult. The weight average molecular weight of the epoxy group-containing acrylic rubber is preferably not more than 2,000,000, since as the molecular weight increases, flowability is reduced, resulting in poor circuit filling.

The functional group-containing monomer used in the present invention is glycidyl acrylate or glycidyl methacrylate, because polymers containing carboxylic acid-type structural units, such as acrylic acid, or hydroxyl-type structural units, such as hydroxymethyl acrylate or hydroxymethyl methacrylate, accelerate cross-linking, thereby producing undesirable effects, such as gelation of the adhesive composition in varnish form, or decrease of bonding strength due to increase of cure degree in B-stage.

The amount of glycidyl acrylate or glycidyl methacrylate is 2 to 6% by weight. If the amount of glycidyl acrylate-or glycidyl methacrylate is less than 2% by weight, sufficient bonding strength cannot be attained, and if it is more than 6% by weight, gelation cannot be prevented. Glycidyl acrylate and glycidyl methacrylate may be used individually or as a mixture thereof.

The rest of the copolymerization monomers is ethyl acrylate, ethyl methacrylate, butyl acrylate, butyl methacrylate or a mixture of two or more.

The copolymerization ratios of these components should be selected in consideration of the Tg of the copolymer. That is, the copolymerization ratios should be selected so as to adjust the Tg to −10° C. or higher, because if Tg is lower than −10° C., adhesive film in semi-cured state (B-stage) will be difficult to handle due to increased tackiness. The desirable copolymerization ratios can be obtained by experiments. For example, the Tg of copolymer of ethyl acrylate, acrylonitrile and glycidyl methacrylate can be adjusted to −10° C. with a copolymerization ratio of 67:30:3.

The epoxy group-containing acrylic rubber may be produced, for example, by pearl polymerization or emulsion polymerization.

An example of commercially available, useful epoxy group-containing acrylic rubbers is HTR-860P-3 (trade name, produced by Teikoku Kagaku Sangyo Co., Ltd.).

Component (b)

Epoxy resins which may be used in the adhesive composition for ensuring insulation and endowing adhering properties are, for example, bisphenol A epoxy resins and bisphenol F epoxy resins, preferably epoxy resins having two or more functionality and a weight average molecular weight of not more than 5,000, more preferably not more than 3,000, and particularly preferred are liquid resins, such as bisphenol A epoxy resins or bisphenol F epoxy resins having a weight average molecular weight of 500 or less, to improve the flowability during lamination.

Examples of commercially available bisphenol A epoxy resins and bisphenol F epoxy resins having a weight average molecular weight of 500 or less are EPIKOTE 807, EPIKOTE 827, EPIKOTE 828 (trade names, all produced by Yuka Shell Epoxy Co., Ltd.), D.E.R. 330, D.E.R. 331, D.E.R 361 (trade names, all produced by Dow Chemical Japan Co., Ltd.), and YD 8125 and YDF 170 (trade names, all produced by Tohto Kasei Co., Ltd.).

To endow the adhesive composition with non-flammability, brominated epoxy resins or non-halogenized non-flammable epoxy resins may also be used, for example, commercially available ESB 400 (trade name, produced by Sumitomo Chemical Co., Ltd.).

To further decrease thermal expansion and to increase Tg, polyfunctional epoxy resins may be added. Examples of such epoxy resins include phenol novolac epoxy resins, cresol novolac epoxy resins, naphthalene epoxy resins and salicylaldehyde novolac epoxy resins.

Examples of commercially available polyfunctional epoxy resins are a phenol novolac epoxy resin EPPN-201 (trade name, produced by Nippon Kayaku Co., Ltd.), cresol novolac epoxy resins ESCN 1012, ESCN 1025, ESCN 1027, ESCN 001 (trade names, all produced by Sumitomo Chemical Co., Ltd.) and N-673-80M (trade name, produced by Dainippon Ink & Chemicals, Inc.), naphthalene epoxy resins HP-4032 (trade name, produced by Dainippon Ink & Chemicals, Inc.) and NC 7000 (trade name, produced by Nippon Kayaku Co., Ltd.) and salicylaldehyde novolac epoxy resins EPPN 502 (trade name, produced by Nippon Kayaku Co., Ltd.) and TACTIX 742 (trade name, produced by Dow Chemical Co., Ltd.).

Curing agents which are suitable for curing the epoxy resins are compounds which have at least two phenolic hydroxyl groups per molecule and are excellent in electrolytic corrosion resistance at the time of moisture absorption, such as phenol novolac resins, bisphenol novolac resins, cresol novolac resins and salicylaldehyde novolac resins, and examples of commercially available ones are PHENOLITE LF2882, PHENOLITE LF2822, PHENOLITE TD-2090, PHENOLITE TD-2149, PHENOLITE VH4150, PHENOLITE VH4170 (trade names, all produced by Dainippon Ink & Chemicals, Inc.) and NH-7000 (trade name, produced by Nippon Kayaku Co., Ltd.).

The total amount of the epoxy resin and the curing agent is 50 to 70 parts by weight per 71 to 100 parts by weight of the epoxy group-containing acrylic rubber. If the total amount of the epoxy resin and the curing agent is less than 50 parts by weight per 71 to 100 parts by weight of the epoxy group-containing acrylic rubber, there may tend to occur a decrease of adhering properties due to the reduced adhering components and a deterioration of circuit filling due to the decreased flowability, and if it is more than 70 parts by weight, flowability may increase, to make it difficult to control the exudation of resins into cavities, and processability may be lost due to reduced flexible ingredients.

Component (c)

Examples of high-molecular weight resins being compatible with the epoxy resin and having a weight average molecular weight of 30,000 or above include phenoxy resins, high-molecular weight epoxy resins having a weight average molecular weight of 30,000 to 80,000, ultra high-molecular weight epoxy resins having a weight average molecular weight of more than 80,000, and rubbers containing functional groups of high polarity. Examples of the rubbers containing functional groups of high polarity are acrylonitrile-butadiene rubbers or acrylic rubbers, to which functional groups of high polarity, such as carboxyl groups, are added.

Commercially available examples of the component (c) are phenoxy resins PHENOTOHTO YP-40, PHNOTOHTO YP-50, PHENOTOHTO YP-60 (trade names, all produced by Tohto Kasei Co., Ltd.), HME series (trade names, produced by Hitachi Chemical Company, Ltd.) which are high-molecular weight epoxy resins and ultra high-molecular weight epoxy resins having a weight average molecular weight of more than 80,000, and reactive rubbers containing functional groups of high polarity PNR-1 (trade name, a carboxyl group-containing acrylonitrile-butadiene rubber produced by Japan Synthetic Rubber Co., Ltd.), NIPOL 1072 (trade name, a carboxyl group-containing acrylonitrile-butadiene rubber produced by Nippon Zeon Co., Ltd.) and HTR-860P (trade name, a carboxyl group-containing acrylic rubber produced by Teikoku Kagaku Co., Ltd.).

In the adhesive composition, the amount of the high-molecular weight resin being compatible with the epoxy resin and having a weight average molecular weight of 30,000 or above is 10 to 60 parts by weight per 71 to 100 parts by weight of the epoxy group-containing acrylic rubber. If it is less than 10 parts by weight, the flexibility of the phase comprising mainly of the epoxy resin (hereinafter, will be referred to as epoxy resin phase) may become insufficient to ensure easy handling, and if it is more than 60 parts by weight, the ratio of the phase comprising the epoxy resin and the high-molecular weight resin compatible with the epoxy resin increases, while the flexible phase comprising mainly of high-molecular weight resins incompatible with the epoxy resin (hereinafter, will be referred to as flexible phase) decreases, so that elasticity increases and thereby increasing elasticity and decreasing soldering heat resistance.

Component (d)

Cure accelerators which are preferably used in the present invention are imidazoles. Examples of imidazoles are 2-methylimidazole, 2-ethyl-4-methylimidazole, 1-cyanoethyl-2-phenylimidazole and 1-cyanoethyl-2-phenylimidazolium trimellitate.

Examples of commercially available imidazoles include CURESOL 2E4MZ, CURESOL 2PZ-CN and CURESOL 2PZ-CNS (trade names, produced by Shikoku Kasei Kogyo Co., Ltd.).

In the present invention, the cure accelerator is used in an amount of 0.1 to 5 parts by weight per 71 to 100 parts by weight of the epoxy group-containing acrylic rubber. If it is less than 0.1 parts by weight, the curing reaction will proceeds slowly, and the insulation layer will be poor in properties, such as adhering properties, due to insufficient curing, and if it is more than 5 parts by weight, the decreased storage stability of adhesive varnish and adhesive film will interfere the quality control.

High-molecular weight resin which is incompatible with the epoxy resin, has a weight average molecular weight of 30,000 or above and is different from the component (a)

The adhesive composition may further contain a high-molecular weight resin which is incompatible with the epoxy resin, has a weight average molecular weight of 30,000 to 100,000 and is different from the component (a). The weight average molecular weight of the high-molecular weight resins incompatible with the epoxy resin should be at least 30,000, so that molecules compatible with the epoxy resin and molecules incompatible with the epoxy resin tangle with each other to prevent phase separation.

To facilitate handling at room temperature, the amount of the high-molecular weight resin incompatible with the epoxy resin is preferably 1 to 50 parts by weight per 71 to 100 parts by weight of the epoxy group-containing acrylic rubber having a weight average molecular weight of 100,000 or above (component (a)).

The high-molecular weight resin incompatible with the epoxy resin may have the same copolymerization units with those of the component (a) so far as it is different from the component (a), for example, if it has a weight average molecular weight of not less than 30,000 and less than 100,000 or a Tg of lower than −10° C. or a content of copolymerized glycidyl acrylate or glycidyl methacrylate of less than 2% by weight or more than 6% by weight.

Examples of high-molecular weight resins, which are incompatible with the epoxy resin, have a weight average molecular weight of 30,000 or above and are different from the component (a), are non-modified acrylic rubbers and rubbers containing functional groups of low polarity. The rubbers containing functional groups of low polarity are rubbers, such as acrylonitrile-butadiene rubbers, to which functional groups of low polarity, such as epoxy groups, are added.

Inorganic filler

To control coefficient of thermal expansion and elastic modulus, the adhesive composition may further contain 9 to 57% by weight of inorganic fillers based on the total weight of the adhesive composition. Within the above range, the mixing ratio of the inorganic fillers is selected so that the adhesive composition provides a cured product, namely the insulation adhesive layer, having an elastic modulus of 1,400 MPa or less, preferably 700 MPa or less, and a coefficient of thermal expansion of 450 ppm/° C. or less. The applicable mixing ratio of the inorganic filler can be determined by experiments.

Examples of inorganic fillers which may be used in the present invention include aluminum hydroxide, magnesium hydroxide, calcium carbonate, magnesium carbonate, calcium silicate, magnesium silicate, calcium oxide, magnesium oxide, alumna, aluminum nitride, aluminum borate whisker, boron nitride, crystalline silica and amorphous silica.

If the amount of inorganic fillers is less than 9% by weight, the control of coefficient of thermal expansion and elastic modulus will not be expectable, and if it is more than 57% by weight, the heat resistance of wiring boards having through hole structures will be lowered due to increased elastic modulus.

Coupling agent

To improve the interfacial bonding among the components of different kinds, the adhesive composition may further contain coupling agents. Preferred coupling agents are silane coupling agents.

Examples of silane coupling agents include
γ-glycidoxypropyltrimethoxysilane,
γ-mercaptopropyltrimethoxysilane,
γ-aminopropyltriethoxysilane,
γ-ureidopropyltriethoxysilane and N-β-aminoethyl-γ-aminopropyltrimethoxysilane.

Examples of commercially available and useful silane coupling agents are NUC A-187 (trade name, γ-glycidoxypropyltrimethoxysilane produced by Nippon Unicar Co., Ltd.), NUC A-189 (trade name, γ-mercaptopropyltrimethoxysilane produced by Japan Unicar Co., Ltd.), NUC A-1100 (trade name, γ-aminopropyltriethoxysilane produced by Japan Unicar Co., Ltd.), NUC A-1160 (trade name, γ-ureidopropyltriethoxysilane produced by Japan Unicar Co., Ltd.) and NUC A-1120 (trade name, N-β-aminoethyl-γ-aminopropyltrimethoxysilane produced by Japan Unicar Co., Ltd.).

The amount of coupling agents is preferably 0.5 to 10 parts by weight per 71 to 100 parts by weight of the epoxy group-containing acrylic rubber. If it is less than 0.5 parts by weight, improvement of adhesion will not be expectable, and if it is more than 10 parts by weight, various problems, such as decrease of heat resistance and increase of cost, may arise.

Inorganic ion adsorbent

To improve the insulation reliability at the time of moisture absorption by adsorption of ionic impurities, the adhesive composition may further contain inorganic ion adsorbents. Inorganic ion adsorbents include inorganic ion adsorbents which physically adsorb inorganic ions, ion exchangers which undergo ion exchange reactions and others having both functions.

Those which physically adsorb inorganic ions are inorganic solids which separate ions from liquids or solids by mass transfer using the adsorbing ability of their porosity, and include, for example, active carbon, natural and synthetic zeolites, silica gel, activated alumina and activated clay, which are excellent in heat resistance and chemical resistance.

Inorganic ion exchangers separate ions from liquids or solids by ion exchange reactions, and include, for example, synthetic aluminosilicates, such as synthetic zeolites, hydrated oxides of metals, such as antimony pentoxide hydrate, and acidic salts of polyfunctional metals, such as zirconium phosphate. Silica gel and activated clay also work as inorganic ion exchangers. Hydrotalcites are known to bind halogens and are a kind of inorganic ion exchangers.

Examples of commercially available inorganic ion adsorbents are IXE-100 (trade name) comprising zirconium compounds, IXE-600 (trade name) comprising antimony-bismuth compounds and IXE-700 (trade name) comprising magnesium-aluminum compounds, all produced by Toagosei Chemical Co., Ltd. An example of commercially available hydrotalcites is DHT-4A (trade name) produced by Kyowa Kagaku Kogyo Co., Ltd.

The amount of inorganic ion adsorbents is preferably 0.5 to 10 parts by weight per 71 to 100 parts by weight of the epoxy group-containing acrylic rubber. If it is less than 0.5 parts by weight, improvement of insulation reliability at the time of moisture absorption will not be expectable, and if it is more than 10 parts by weight, various problems, such as decrease of heat resistance and increase of cost, will arise.

Other additives

To prevent ionization and elution of ionized copper, compounds known as anti-copper damage agents, such as triazinethiol compounds and bisphenol reductants, may also be added. Examples of bisphenol reductants are 2,2'-methylene-bis(4-methyl-6-tert-butylphenol) and 4,4'-thio-bis(3-methyl-6-tert-butylphenol).

An anti-copper damage agent comprising triazinethiol compounds is marketed by Sankyo Seiyaku Co., Ltd. by the trade name of GISNET DB. An anti-copper damage agent comprising bisphenol reductants is marketed by Yoshitomi Seiyaku Co., Ltd. by the trade name of YOSHINOX BB.

The adhesive composition is made into varnish form by dissolving or dispersing the above-described components in solvents, applied to a base film, heated to remove the solvents, so that it is used in a form of an adhesive film of semi-cured state. To protect the bonding surfaces of the adhesive film, a cover film may be applied to the adhesive film on the surface which is not covered by the base film.

Examples of plastic films which may be used as the base film and the cover film include Teflon film, release-treated polyethyleneterephthalate film, polyethylene film, polypropylene film and polyimide film.

Examples of commercially available plastic films are KAPTON (trade name, produced by Toray Du Pont Co., Ltd.) and APICAL (trade name, produced by Kanegafuchi Chemical Industry Co., Ltd.) which are polyimide films, and LUMILAR (trade name, produced by Toray Du Pont Co., Ltd.) and PULEX (trade name, produced by Teijin Ltd.) which are polyethyleneterephthalate films.

Solvents which are suitable for the preparation of the varnish are those having a relatively low boiling point, such as methyl ethyl ketone, acetone, methyl isobutyl ketone, 2-ethyoxyethanol, toluene, butyl cellosolve, methanol, ethanol or 2-methoxyethanol. Solvents having high boiling points may be added to improve coating quality. Examples of solvents having high boiling points are dimethylacetamide, dimethylformamide, methylpyrrolidone and cyclohexanone.

The varnish may be prepared by any method which can mix the resin components, such as propeller stirring. When inorganic fillers are added, any kneading method can be employed if it can disperse the inorganic fillers sufficiently. For example, mixing and drilling machine, three rolls or beads mill, or a combination of two or more of them may be employed. Also the mixing time can be reduced by adding high-molecular weight components after fillers are mixed with low molecular weight matters. The varnish thus prepared is preferably vacuum-degasified to remove the bubbles incorporated in the varnish.

The removal of solvents from the varnish is performed preferably at 100 to 200° C., to obtain adhesive film of semi-cured state, which is preferably 10 to 200 $\mu$m thick.

Elastic modulus

The insulation adhesive layer in the multilayer wiring board for mounting semiconductor devices of the prevent invention is preferably 10 to 200 $\mu$m thick, and should have an elastic modulus of 1,400 MPa or less, preferably 700 MPa or less. If the elastic modulus is more than 1,400 MPa, the stress generated at the time of soldering between through holes increases, to lower the soldering heat resistance.

Soldering heat resistance varies depending on the pitch spaces between through holes. When the pitch spaces between through holes are 2.54 mm or more, the elastic modulus of the insulation adhesive layer may be 1,400 MPa or less, but when the pitch spaces between through holes are less than 2.54 mm, the elastic modulus is preferably 700 MPa or less.

Herein, the elastic modulus of insulation adhesive layers is measured by a tensile test of a sample of film form of 100 mm in length, 10 mm in width and 50 to 200 $\mu$m in thickness, under the testing conditions of an inter-chuck space of 50 mm and a tensile speed of 50 mm/min.

Coefficient of thermal expansion in the direction of thickness

The insulation adhesive layer should have a coefficient of thermal expansion of 450 ppm/° C. or less in the direction of thickness, and if the coefficient of thermal expansion is higher than 450 ppm/° C., the expansion of the insulation adhesive layer at high temperatures will increase, to decrease connection reliability.

Herein, the coefficient of thermal expansion in the direction of thickness is measured by heating a sample of film form of 50 to 200 $\mu$m thick by a compression method at a heating rate of 5 to 10° C./min, using a thermomechanical analyzer.

The multilayer wiring board for mounting semiconductor devices of the present invention may be produced by the method of the present invention. According to the method of the present invention, a multilayer wiring board, which is for mounting a semiconductor device and has a multi-bonding-deck cavity, is produced by putting in layers at least two wiring boards (a first wiring board and a second wiring board) having their respective cavities, with an adhesive film, which is a semi-cured product of the above-described adhesive composition and has a cavity, disposed therebetween, and bonding the laminate composite with heat and pressure. According to demands, a copper-clad laminate may further be put on at least one surface of the laminate composite, with an adhesive film disposed therebetween.

Each wiring board has at least one wiring surface bearing circuit-patterned conductor and has wire bonding pad areas around the cavity. Connection terminals are also made on the wiring boards. The wiring boards may have circuit patterned conductor on both sides. The cavity of the first wiring board is larger than the cavity of the second wiring board, and the circumference of the cavity of the first wiring board is the same in size and shape as the cavity of the adhesive film which is disposed between the first and second wiring boards. The cavities in the adhesive film and the wiring boards may be formed by punching with a knife die or by cutting with a router. At the time of forming the cavity in the adhesive film, the base film and the optional cover film protect the adhesive film, and prevents scattering of resin powder. The base film and cover film are removed at the time of the following lamination. The wiring boards and the adhesive film are put in layers, so that the circumference of the cavity of the first wiring board is located exterior to the circumference of the cavity of the second wiring board and is located just on the circumference of the cavity of the adhesive film. When a copper-clad laminate is put on the first wiring board, with an adhesive film disposed therebetween, the adhesive film should have a cavity larger than the cavity of the first wiring board, and is put on the first wiring board so that the circumference of the cavity of the adhesive film is located exterior to the circumference of the cavity of the first wiring board.

The wiring boards to be used in the present invention may be produced from common copper-clad laminates, such as FR-4 or CEM-3.

Examples of commercially available copper-clad laminates are MCL-E-67 and MCL-E-679 (trade names, produced by Hitachi Chemical Company, Ltd.).

The bonding with heat and pressure is preferably carried out at a pressure of 1.0 to 4.0 MPa, and heating the laminate gradually, and then maintaining the laminate at 160 to 180° C., more preferably 170 to 180° C., for 30 to 120 minutes.

It is preferable to carry out the bonding with heat and pressure so that the adhesive film has the lowest viscosity of $3\times10^4$ to $1\times10^5$ Pa·s during the bonding. At the initial heating stage, the laminate is preferably heated at a rate of heating of 5 to 10° C./min, so that the adhesive film has a lowest viscosity of $3\times10^4$ to $1\times10^5$ Pa·s while the temperature rises. Therefore, it is preferable to carry out the bonding with heat and pressure by heating the laminate composite up to 160 to 180° C. at a rate of heating of 5 to 10° C./min at a pressure of 1.0 to 4.0 MPa, and then heating the laminate at 160 to 180° C. at a pressure of 1.0 to 4.0 MPa for 30 to 120 minutes, so that the adhesive film has the lowest viscosity of $3\times10^4$ to $1\times10^5$ Pa·s during the bonding process. It is more preferable to carry out the bonding with heat and pressure by heating the laminate composite up to 170 to 180° C. at a rate of heating of 5 to 10° C./min at a pressure of 1.0 to 4.0 MPa, and then heating the laminate at 170 to 180° C. at a pressure of 1.0 to 4.0 MPa for 30 to 120 minutes, so that the adhesive film has the lowest viscosity of $3\times10^4$ to $1\times10^5$ Pa·s during the bonding process.

To control the flow of adhesives constructing adhesive films, it is necessary to control the parameters indicating the flowability of the adhesives. We paid attention to viscosity as a parameter. That is, adhesives of high viscosity has low flowability, and adhesives of low viscosity has high flowability. The viscosity depends on the composition of adhesives, degree of cure and temperature. As to the composition of adhesives, the viscosity increases with increasing content of resins having high-molecular weight chains. The reason is that the molecular motion of the resins is restricted. In the field of sealing materials for semiconductor packaging, it is also known that when fillers are added, flow viscosity varies depending on the shape of fillers. As to the degree of cure, the viscosity increases with progress of cure. The reason is that bonding of molecule chains proceeds with progress of cure, to restrict molecular motion. When a degree of cure is maintained, the higher the temperature is, the lower the viscosity is. The reason is that molecular motion becomes more active as the temperature increases.

Figure 2:
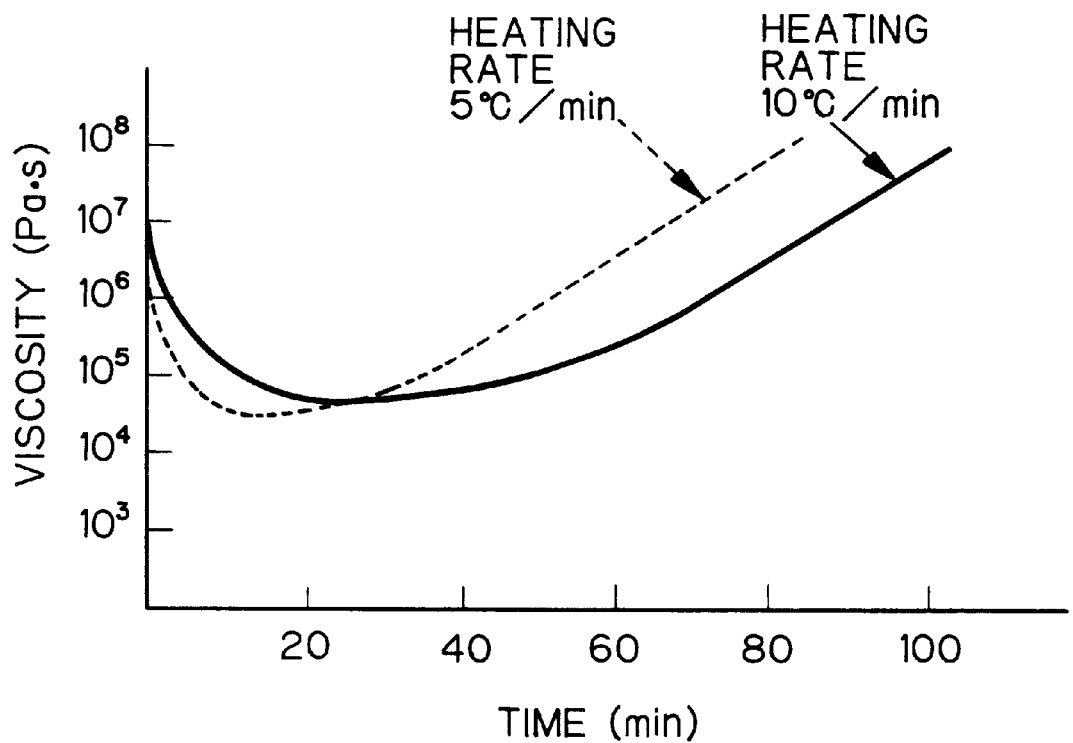
FIG. 2 is a graph showing examples of the changes of the viscosity of an adhesive film with the passage of time which is obtained from the results of measurement of visco-elastic modulus of the adhesive film in which the adhesive film was heated gradually.

Generally, at the time of lamination, thermosetting adhesive films are used in semi-cured state. The viscosity of adhesive films in semi-cured state initially decreases on heating, and then increases with progress of cure. FIG. 2 shows examples of the changes of viscosity.

Generally, the viscosity decreases sharply on rapid heating. The reason is that the decrease of viscosity owing to the temperature increase overwhelms the increase of viscosity owing to the curing reaction of adhesives. The decrease of the lowest viscosity causes an increase in the amount of flowing adhesives. Therefore, to control the flow of adhesives by balancing the decrease of the viscosity owing to the temperature increase with the increase of the viscosity owing to the curing reaction of adhesives, it is desirable to carry out the bonding of the laminate composite by heating at a proper rate of heating. Considering the capacity of common press machines, the influence of buffers (such as paper or plastic film) and the time of bonding, a heating rate of 5 to 10° C./min is practical. Generally, bonding with heat and pressure using glass-epoxy resin materials, which have been used for the production of conventional wiring boards, is carried out at 170 to 180° C. in consideration of the reaction temperature of epoxy resins, and many of conventional press apparatuses are constructed so that they can perform pressing at this temperature range.

Adhesive films or press conditions have been investigated to control the resin flow, but quantitative determination of the properties of adhesive films that correlate with the resin flow, determination of appropriate ranges of the properties and development of adhesive films satisfying the appropriate ranges have been the problems to be solved.

We have investigated the properties of adhesive films that correlate with the resin flow, and have consequently found that the resin flow correlates with the viscosity, particularly the lowest viscosity. That is, when the lowest viscosity is too low, the exudation into cavities increases due to high flowability. When the lowest viscosity is too high, bubbles remain on the sides of copper foil patterns forming signal circuits due to poor flowability, thereby decreasing the insulation reliability. We have determined that the desirable lowest viscosity ranges from $3\times10^4$ to $1\times10^5$ Pa·s to control the exudation to 0 to 300 μm and to fill 35 μm thick copper foil circuits without problems. When the lowest viscosity is lower than $3\times10^4$ Pa·s, the resin flow (exudation) exceeds 300 μm, and when it is higher than $1\times10^5$ Pa·s, bubbles remain on the sides of 35 μm thick copper foil circuits.

EXAMPLES 1 TO 18, COMPARATIVE EXAMPLES 1 TO 6 AND REFERENCE EXAMPLE 1

Production of Adhesive Film (A)

(adhesive films 1 to 14)

200 g in total of the components as shown in Tables 1 and 2 were added to 1.0 liter of methyl ethyl ketone, mixed and vacuum-degasified, to give a varnish, which was then poured over a base film made of polyethyleneterephthalate (trade name: PULEX, a plastic carrier film produced by Teijin, Ltd.), heated to dry at 140° C. for 5 minutes, to obtain adhesive films 1 to 14 of 100 μm thick in semi-cured state.

When inorganic fillers were used, the preparation of varnish was carried out by adding all components except for the cure accelerator to methyl ethyl ketone, kneading the mixture with a beads mill, and then adding thereto the cure accelerator and vacuum-degasifying.

The details of the components listed in Tables 1 and 2 are as follows.

(a) Epoxy group-containing acrylic rubber

HTR-860P-3 (trade name, produced by Teikoku Kagaku Sangyo Co., Ltd., $M_w$: 1,000,000)

(b) Epoxy resin

Liquid epoxy resin

EPIKOTE 828 (trade name, bisphenol A epoxy resin, $M_w$: 340, produced by Yuka Shell Epoxy Co., Ltd.)

YD 8125 (trade name, bisphenol A epoxy resin, $M_w$: 340, produced by Tohto Kasei Co., Ltd.)

Polyfunctional epoxy resin

Cresol novolac epoxy resin:

ESCN 001 (trade name, produced by Sumitomo Chemical Co., Ltd., $M_w$: 1,000)

N-673-80M (trade name, produced by Dainippon Ink & Chemicals, Inc., $M_w$: 1,000)

Salicylaldehyde novolac epoxy resin:

TACTIX (trade name, produced by Dow Chemical Co., Ltd., $M_w$: 460)

EPPN 502 (trade name, produced by Nippon Kayaku Co., Ltd., $M_w$: 900)

Naphthalene epoxy resin:

NC 7000 (trade name, produced by Nippon Kayaku Co., Ltd., $M_w$: 590)

Non-flammable epoxy resin

ESB-400 (trade name, brominated bisphenol A epoxy resin, $M_w$: 630, produced by Sumitomo Chemical Co., Ltd.)

Curing agent

Bisphenol A novolac resin:

PHENOLITE LF2882 (trade name, produced by Dainippon Ink & Chemicals, Inc., $M_w$: 1,000)

PHENOLITE LF2822 (trade name, produced by Dainippon Ink & Chemicals, Inc., $M_w$: 700)

Naphthalene novolac resin

NH 7000 (trade name, produced by Nippon Kayaku Co., Ltd., $M_w$: 470)

(c) High-molecular weight resin being compatible with epoxy resin and having a weight average molecular weight of 30,000 or above Phenoxy resin:

PHENOTOHTO YP-50 (trade name, produced by Tohto Kasei Co., Ltd. $M_w$ 50,000)

(d) Cure accelerator

2PZ-CN (trade name, 1-cyanoethyl-2-phenylimidazole, produced by Shikoku Kasei Kogyo Co., Ltd.)

(e) Inorganic filler

Alumina filler: AL-160SG-1 (trade name, produced by Showa Denko K. K.)

Silica filler: ZA-30 (trade name, produced by Tatsumori Ltd.)

(f) Coupling agent

γ-glycidoxypropyltrimethoxysilane: NUC A-187 (trade name, produced by Japan Unicar Co., Ltd.)

(g) Anti-copper damage agent: YOSHINOX BB (trade name, produced by Yoshitomi Seiyaku Co., Ltd.)

(h) Solvent: methyl ethyl ketone (i) Inorganic ion adsorbent: IXE-600 (trade name: produced by Toagosei Chemical Co., Ltd.)

EXAMPLES 1 TO 14

Each example was conducted as follows. In these Examples, no cavity was formed.

A wiring board A was produced by forming etching resist on predetermined areas of the both sides of MCL-E-679 (trade name, produced by Hitachi Chemical Co., Ltd.), which is a both-sided copper-clad glass/epoxy laminate of 0.9 mm thick produced by bonding copper foil of 18 μm thick on both sides of an epoxy resin-impregnated glass cloth board, and then removing unnecessary parts of the copper foil by etching. A wiring board B was produced in the same manner. The surfaces of the circuits on the wiring board A and the wiring board B were roughened with an oxidation treatment liquid comprising mainly of sodium hypochlorite and a reduction treatment liquid comprising mainly of dimethylaminoborane.

A multilayer board was produced by putting in layers wiring board A/adhesive film listed in Table 1/wiring board B/adhesive film listed in Table 1/MCL-E-679 (trade name, produced by Hitachi Chemical Company, Ltd., a single-sided copper-clad laminate of 0.6 mm thick produced by applying copper foil of 18 μm thick to a side of an epoxy resin-impregnated glass cloth board) in this order, and then bonding the laminate composite with heat and pressure under the press conditions of 170° C.•3 MPa•60 minutes.

The multilayer board was drilled at predetermined points with a drill of 0.5 mm in diameter to form through holes. After pretreatments for electroless plating, including washing, addition of catalysts and adhesion improvement, electroless copper plate layer of about 20 μm thick was formed on the internal walls of the through holes and the surface of copper foil by electroless copper plating.

To form pads and circuit patterns on the surface of the multilayer board, etching resist was formed on necessary areas, and unnecessary copper was then removed by etching, to obtain a multilayer wiring board.

Figure 4:
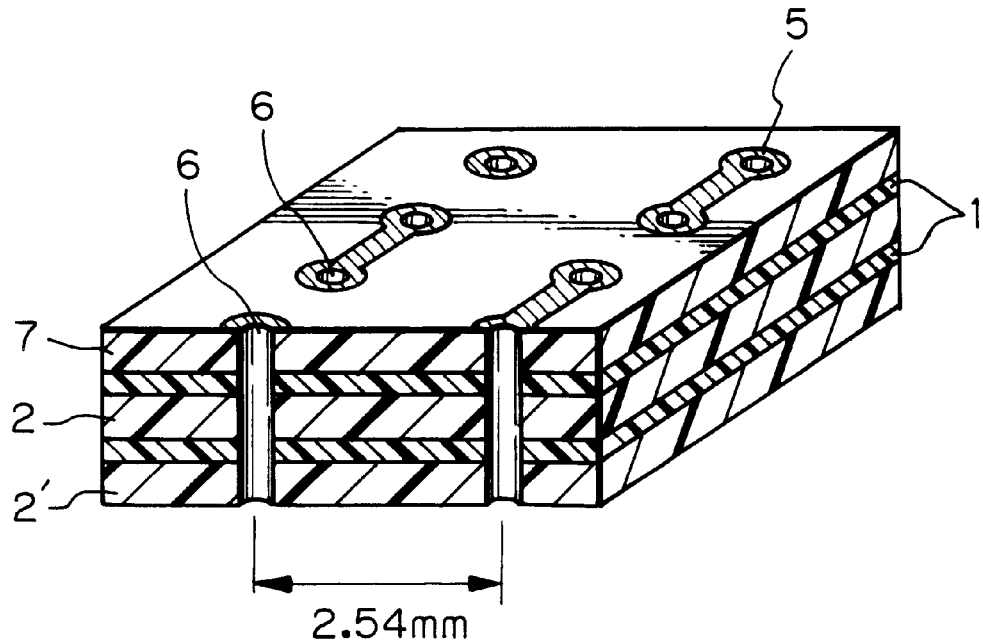
FIG. 4 is a partially sectional, perspective view of a multilayer wiring board for mounting semiconductor devices of an embodiment according to the present invention.
Figure 5:
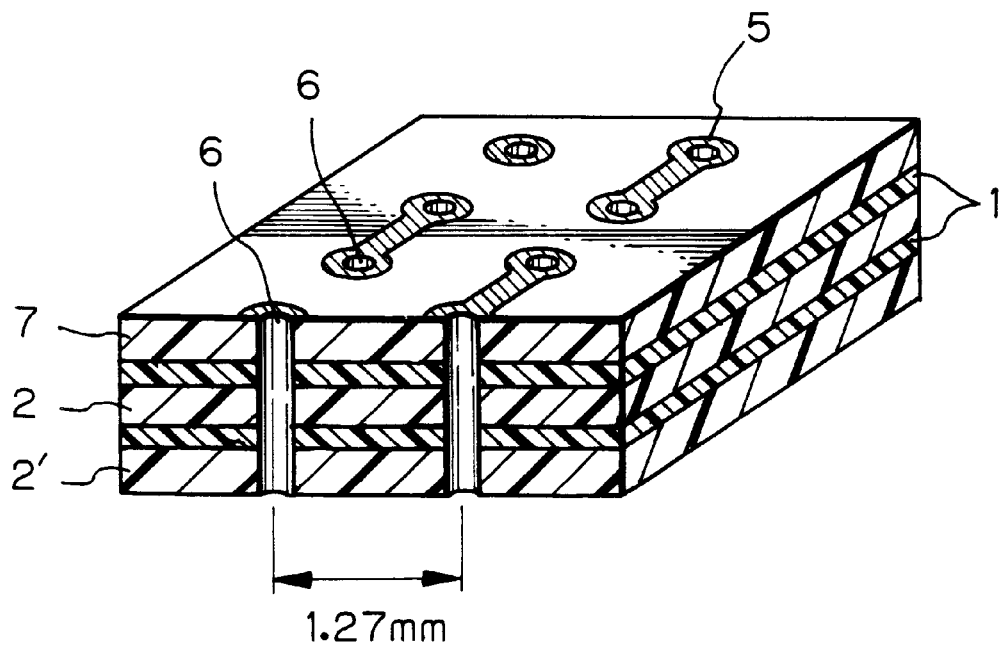
FIG. 5 is a partially sectional, perspective view of a multilayer wiring board for mounting semiconductor devices of another embodiment according to the present invention.

The multilayer wiring board had through holes 5 spaced in 2.54 mm pitch as shown in FIG. 4. Another multilayer wiring board was produced in the same manner as above, except that through holes 5 spaced in 1.27 mm pitch were made as shown in FIG. 5. In FIGS. 4 and 5, a reference numeral 1 indicates an insulation adhesive layer, a reference numeral 2 indicates the circuit board A, a reference numeral 2' indicates the circuit board B, a reference numeral 5 indicates a connection terminal and a reference numeral 6 indicates a through hole.

COMPARATIVE EXAMPLES 1 TO 3

Multilayer wiring boards were produced in the same manner as in Examples 1 to 14, except that adhesive films 15–17 made from the components as shown in Table 1 were used.

The multilayer wiring boards produced in Examples 1 to 14 and Comparative Examples 1 to 3 were tested as follows.

Soldering heat resistance

The multilayer wiring boards produced in the above Examples and Comparative Examples were tested for soldering heat resistance by allowing them to float for 20 seconds in a solder bath heated to 260° C., and then allowing them to cool down to room temperature. After the test for soldering heat resistance, samples were cut out from the multilayer wiring boards and ground in the direction of thickness down to adhesive layers. The adhesive layers were observed with a stereoscopic microscope of 50–100 magnification, and those free of blister were rated as "good", and those with blister were rated as "poor".

Test for connection reliability

The multilayer wiring boards produced in the above Examples and Comparative Examples were subjected to a thermal shock test to evaluate them for connection reliability. The thermal shock test was carried out in gas phase, and test pieces were exposed to –65° C. for 30 minutes, to room temperature for 5 minutes, to 125° C. for 30 minutes and to room temperature for 5 minutes, in this order, in one cycle. The connection resistance of the through holes were measured after every 100th cycle, and the number of cycles at which the resistance increased by 10% or higher was designated as an end point. Those having an end point of 500 cycles or more were rated as "good", and those having an end point of less than 500 cycles were rated as "poor".

Elastic modulus

The measurement of elastic modulus was made by subjecting a sample of film form of 100 mm in length, 10 mm in width and 100 μm in thickness, which was obtained by heating and pressing an adhesive film under the same conditions as those employed for the bonding of laminate composites, to a tensile test under the conditions of an inter-chuck space of 50 mm, a tensile speed of 50 mm/min and a measuring temperature of 25° C., by using AUTOGRAPH AG-100C (trade name, produced by Shimazu Seisakusho Co., Ltd.).

Linear expansivity

The measurement of linear expansivity was made by heating a sample of film form, which was the same as that used in the test for elastic modulus except that this sample was 5 mm in length, 5 mm in width and 100 μm in thickness, from 30° C. up to 130° at a heating rate of 5 to 10° C./min under a constant compression, using a thermomechanical analyzer, Du Pont 943 TMA (trade name, produced by E. I. Du Pont de Nemours and Company).

TABLE 1

|  |  |  | Example Nos. | | | | | | | | |
|---|---|---|---|---|---|---|---|---|---|---|---|
|  |  |  | 1 | 2 | 3 | 4 | 5 | 6 | 7 | 8 | 9 |
| Adhesive film No. |  |  | 1 | 2 | 3 | 4 | 5 | 6 | 7 | 8 | 9 |
| Epoxy group-containing acrylic rubber | wt. part | HTR-860P-3 | 96 | 96 | 96 | 96 | 96 | 96 | 96 | 96 | 96 |
| Epoxy resin Liquid epoxy resin | wt. part | EPIKOTE 828 | 30 | 30 | 0 | 30 | 30 | 30 | 30 | 30 | 10 |
|  |  | YD8125 | 0 | 0 | 30 | 0 | 0 | 0 | 0 | 0 | 0 |
| Polyfunctional epoxy resin | wt. part | ESCN 001 | 10 | 10 | 0 | 0 | 0 | 0 | 10 | 10 | 10 |
|  |  | N-573-80M | 0 | 0 | 10 | 0 | 0 | 0 | 0 | 0 | 0 |
|  |  | TACTIX 742 | 0 | 0 | 0 | 10 | 0 | 0 | 0 | 0 | 0 |
|  |  | EPPN 502 | 0 | 0 | 0 | 0 | 10 | 0 | 0 | 0 | 0 |
|  |  | NC 7000 | 0 | 0 | 0 | 0 | 0 | 10 | 0 | 0 | 0 |
| Non-flammable epoxy resin | wt. part | ESB-400 | 0 | 0 | 0 | 0 | 0 | 0 | 0 | 0 | 20 |
| Curing agent | wt. part | PHENOLITE LF2882 | 24 | 24 | 24 | 26.4 | 26.2 | 24 | 0 | 0 | 17.6 |
|  |  | PHENOLITE LF2822 | 0 | 0 | 0 | 0 | 0 | 0 | 24 | 0 | 0 |
|  |  | NH 7000 | 0 | 0 | 0 | 0 | 0 | 0 | 0 | 28.5 | 0 |
| High-molecular weight resin compatible with epoxy resin | wt. part | PHENOTOHTO YP-50 | 10 | 10 | 10 | 10 | 10 | 10 | 10 | 10 | 10 |
| Cure accelerator | wt. part | 2PZ-CN | 0.5 | 0.5 | 0.5 | 0.5 | 0.5 | 0.5 | 0.5 | 0.5 | 0.5 |
| Coupling agent | wt. part | A-187 | 0 | 1.5 | 0 | 0 | 0 | 0 | 0 | 0 | 0 |
| Anti-copper damage agent | wt. part | YOSHINOX BB | 0 | 0 | 0 | 0 | 0 | 0 | 0 | 0 | 0 |
| Inorganic filler | wt. part | AL-160SG-1 | 0 | 72 | 0 | 0 | 0 | 0 | 0 | 0 | 0 |
|  |  | ZA-30 | 0 | 0 | 0 | 0 | 0 | 0 | 0 | 0 | 0 |
| Ion adsorbent | wt. part | IXE-600 | 0 | 0 | 0 | 0 | 0 | 0 | 0 | 0 | 0 |

TABLE 2

|  |  |  | Example Nos. | | | | | Comp. Ex. Nos. | | |
|---|---|---|---|---|---|---|---|---|---|---|
|  |  |  | 10 | 11 | 12 | 13 | 14 | 1 | 2 | 3 |
| Adhesive film Nos. |  |  | 10 | 11 | 12 | 13 | 14 | 15 | 16 | 17 |
| Epoxy group-containing acrylic rubber | wt. part | HTR-860p-3 | 96 | 96 | 96 | 96 | 95 | 200 | 10 | 32 |
| Epoxy resin Liquid epoxy resin | wt. part | EPIKOTE 828 | 30 | 30 | 30 | 30 | 30 | 30 | 30 | 30 |
|  |  | YD 8125 | 0 | 0 | 0 | 0 | 0 | 0 | 0 | 0 |
| Polyfunctional epoxy resin | wt. part | ESCN 001 | 10 | 10 | 10 | 10 | 10 | 10 | 10 | 10 |
|  |  | N-573-80M | 0 | 0 | 0 | 0 | 0 | 0 | 0 | 0 |
|  |  | TACTIX 742 | 0 | 0 | 0 | 0 | 0 | 0 | 0 | 0 |
|  |  | EPPN 502 | 0 | 0 | 0 | 0 | 0 | 0 | 0 | 0 |
|  |  | NC 7000 | 0 | 0 | 0 | 0 | 0 | 0 | 0 | 0 |
| Non-flammable epoxy resin | wt. part | ESB-400 | 0 | 0 | 0 | 0 | 0 | 0 | 0 | 0 |
| Curing agent | wt. part | PHENOLITE LF2882 | 0 | 24 | 24 | 24 | 24 | 24 | 24 | 24 |
|  |  | PHENOLITE LF2822 | 24 | 0 | 0 | 0 | 0 | 0 | 0 | 0 |
|  |  | NH 7000 | 0 | 0 | 0 | 0 | 0 | 0 | 0 | 0 |
| High-molecular weight resin compatible with epoxy resin | wt. part | PHENOTOHTO YP-50 | 10 | 10 | 10 | 10 | 10 | 10 | 10 | 10 |
| Cure accelerator | wt. part | 2PZ-CN | 0.5 | 0.5 | 0.5 | 0.5 | 0.5 | 0.5 | 0.5 | 0.5 |
| Coupling agent | wt. part | A-187 | 0 | 0 | 0 | 0 | 0 | 0 | 0 | 3 |
| Anti-copper damage agent | wt. part | YOSHINOX BB | 3 | 0 | 0 | 0 | 0 | 0 | 0 | 0 |
| Inorganic filler | wt. part | AL-160SG-1 | 0 | 0 | 0 | 0 | 0 | 0 | 0 | 160 |
|  |  | ZA-30 | 0 | 35 | 80 | 135 | 0 | 0 | 0 | 0 |
| Ion adsorbent | wt. part | IXE-600 | 0 | 0 | 0 | 0 | 1.5 | 0 | 0 | 0 |

TABLE 3

|  |  |  | Example Nos. | | | | | | | | |
|---|---|---|---|---|---|---|---|---|---|---|---|
|  |  |  | 1 | 2 | 3 | 4 | 5 | 6 | 7 | 8 | 9 |
| Adhesive film Nos. |  |  | 1 | 2 | 3 | 4 | 5 | 6 | 7 | 8 | 9 |
| Results of tests | Elastic modulus | MPa | 300 | 1000 | 300 | 450 | 450 | 470 | 300 | 450 | 470 |
|  | Linear expansivity | ppm/° C. | 400 | 250 | 400 | 370 | 370 | 350 | 400 | 350 | 370 |
|  | Soldering heat resistance | 2.54 mm pitch | good | good | good | good | good | good | good | good | good |
|  |  | 1.27 mm pitch | good | poor | good | good | good | good | good | good | good |
|  | Continuation reliability |  | good | good | good | good | good | good | good | good | good |

TABLE 3-continued

|  |  |  | Example Nos. | | | | | Comp. Example Nos. | | |
| --- | --- | --- | --- | --- | --- | --- | --- | --- | --- | --- |
|  |  |  | 10 | 11 | 12 | 13 | 14 | 1 | 2 | 3 |
| Adhesive film Nos. |  |  | 10 | 11 | 12 | 13 | 14 | 15 | 16 | 17 |
| Results of tests | Elastic modulus | MPa | 300 | 770 | 1050 | 1400 | 300 | 200 | 2200 | 3700 |
|  | Linear expansivity | ppm/° C. | 400 | 300 | 200 | 100 | 400 | 600 | 120 | 100 |
|  | Soldering | 2.54 mm pitch | good | good | good | good | good | good | poor | poor |
|  | heat resistance | 1.27 mm pitch | good | poor | poor | poor | good | good | poor | poor |
|  | Continuation reliability |  | good | good | good | good | good | poor | good | poor |

The multilayer wiring boards produced in Examples 1 to 14 had insulation adhesive layers having an elastic modulus of 1,400 MPa or less and a coefficient of thermal expansion of 450 ppm/° C. or less. When the through hole pitch was 2.54 mm, all of them were excellent in soldering heat resistance and connection reliability. Particularly, the multilayer wiring boards produced in Examples 1 and 3–10 had an elastic modulus of 700 MPa or less, and were excellent in soldering heat resistance and connection reliability even when the through hole pitch was 1.27 mm.

The multilayer wiring board produced in Comparative Example 1 contained a large amount of epoxy group-containing acrylic rubber, which is a component of low elastic modulus, and are inferior in connection reliability due to the high coefficient of thermal expansion of higher than 450 ppm/° C. The multilayer wiring boards produced in Comparative Examples 2 and 3 had an elastic modulus of higher than 1,400 MPa due to the insufficient content of the component of low elastic modulus, and were inferior in soldering heat resistance.

1) Production of adhesive film (B)

Adhesive film was produced in the following manner.
(Adhesive film 18)

First methyl ethyl ketone was added to a composition comprising (a) 96 parts by weight of an epoxy group-containing acrylic rubber (trade name: HTR-860P-3, produced by Teikoku Kagaku Sangyo Co., Ltd., weight average molecular weight: 1,000,000), (b) as epoxy resins, 30 parts by weight a bisphenol A epoxy resin (trade name: EPIKOTE 828, produced by Yuka Shell Epoxy Co., Ltd., epoxy group equivalent: 200, weight average molecular weight: 340) and 10 parts by weight of a cresol novolac epoxy resin (trade name: ESCN 001, produced by Sumitomo Chemical Co., Ltd., epoxy group equivalent: 220, weight average molecular weight: 1,000) and, as a curing agent, 24 parts by weight of a bisphenol A novolac resin (trade name: PHENOLITE LF2882, produced by Dainippon Ink & Chemicals, Inc.), (c) as a high-molecular weight resin being compatible with epoxy resin and having a weight average molecular weight of 30,000 or above, 10 parts by weight of a phenoxy resin (trade name: PHENOTOHTO YP-50, produced by Tohto Kasei Co., Ltd., weight average molecular weight: 50,000) and (e) 72 parts by weight of alumina filler as an inorganic filler, and the mixture was kneaded with a beads mill. Subsequently, the mixture was mixed with (d) 0.5 parts by weight a cure accelerator (trade name: CURESOL 2PZ-CN, 1-cyanoethyl-2-phenylimidazole produced by Shikoku Kasei Kogyo Co., Ltd.), and the mixture was then degasified in vacuum, to give a varnish.

The varnish was applied to a polyethyleneterephthalate film of 50 μm thick (trade name: S-31, produced by Teijin, Ltd.) used as a base film, heated to dry at 140° C. for 5 minutes, to give an adhesive film 18 of 100 μm thick.

2) Production of multilayer wiring board having multi-bonding-deck cavity

EXAMPLE 15

Etching resist was formed on both sides of a both-sided copper-clad glass/epoxy resin laminate of 0.6 mm thick (trade name: MCL-E-679, produced by Hitachi Chemical Company, Ltd.), and unnecessary areas of the copper foil were removed by etching, to obtain a wiring board bearing circuit patterns on both sides. A cavity (a square of 17 mm in each side) was formed in the wiring board using a numerically controlled router, to obtain a wiring board A. A wiring board B was produced in the same manner, with the proviso that the cavity was a square of 15 mm in each side.

The adhesive film 1 was punched using a knife die which had a square blade of 17 mm in each side arranged at the same coordinates as that of the cavity of the wiring board A, to obtain an adhesive film A having a cavity of the same size as that of the wiring board A. In the same manner, an adhesive film B was produced, with the proviso that the cavity was a square of 15 mm in each side. In the same manner, an adhesive film C was produced, with the proviso that the cavity was a square of 19 mm in each side.

Figure 3:
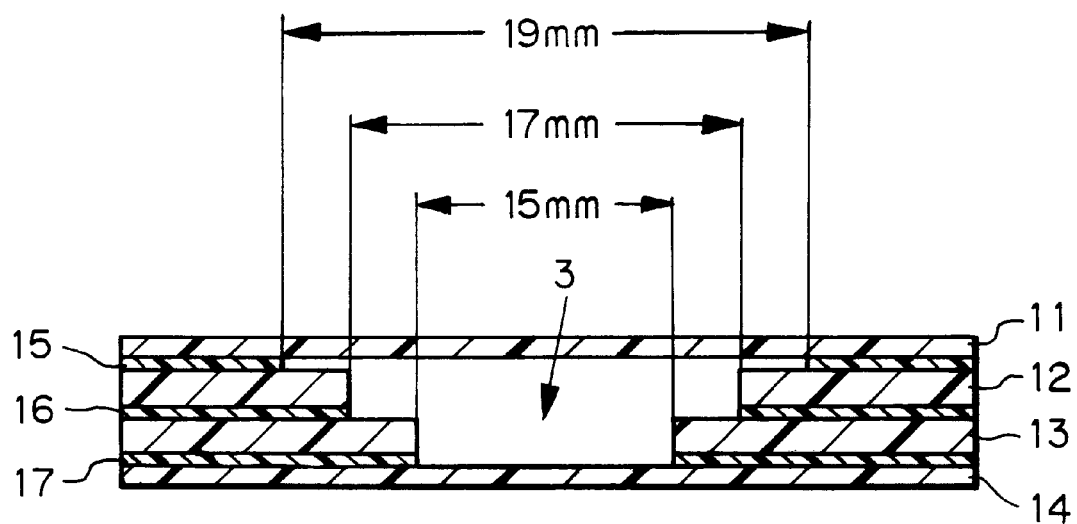
FIG. 3 is a sectional view showing a laminate structure to be bonded with heat and pressure for producing a multilayer wiring board for mounting semiconductor devices which is an embodiment according to the present invention and has a multi-bonding-deck cavity.

After the circuits of the wiring boards A and B were blackened, as shown in FIG. 3, the wiring board A (12), the wiring board B (13), two single-sided copper-clad laminate or 0.4 mm thick (trade name: MCL-E-679, produced by Hitachi Chemical Company, Ltd.) (11, 14), the adhesive film A (16), the adhesive film B (17) and the adhesive film C (15) were put in layers to form a laminate composite. In the laminate composite, the single-sided copper-clad laminates were arranged so that their copper-clad surfaces were exposed on the laminate composite. The laminate composite was bonded by heating up to 170° C. at a heating rate of 5° C./min at a pressure of 3 MPa, and then heating at 170° C. at 3 MPa for 60 minutes.

The bonded laminate composite was drilled at predetermined points with a drill of 0.5 mm in diameter to form through holes. After pretreatments for electroless plating, including washing, addition of catalysts and adhesion improvement, electroless copper plate layer of about 20 μm was formed on the internal walls of the through holes and the surface of copper foil by electroless copper plating.

Etching resist was formed on the copper foil on both sides of the laminate composite at necessary areas to be pad areas, circuit patterns or the like, and then unnecessary copper was removed by etching.

Subsequently, a cavity was formed in the laminate (11) using a numerically controlled router, to expose a multi-bonding-deck cavity having two levels of wire bonding pad areas. Thus a multilayer wiring board having a multi-bonding-deck cavity was obtained.

EXAMPLE 16

A multilayer wiring board having a multi-bonding-deck cavity was produced in the same manner as in Example 15, except that the rate of heating during the bonding with heat and pressure was changed to 10° C./min.

EXAMPLE 17

A multilayer wiring board having a multi-bonding-deck cavity was produced in the same manner as in Example 15, except that the adhesive film 18 was used in place of the adhesive film 1.

EXAMPLE 18

A multilayer wiring board having a multi-bonding-deck cavity was produced in the same manner as in Example 17, except that the rate of heating during the bonding with heat and pressure was changed to 10° C./min.

COMPARATIVE EXAMPLE 4

A multilayer wiring board having a multi-bonding-deck cavity was produced in the same manner as in Example 15, except that the adhesive film 16 was used in place of the adhesive film 1.

COMPARATIVE EXAMPLE 5

A multilayer wiring board having a multi-bonding-deck cavity was produced in the same manner as in Example 16, except that the adhesive film 16 was used in place of the adhesive film 1.

REFERENCE EXAMPLE 6

A multilayer wiring board having a multi-bonding-deck cavity was produced in the same manner as in Example 15, except that the rate of heating during the bonding with heat and pressure was changed to 3° C./min.

The multilayer wiring boards produced in Examples 15 to 18, Comparative Examples 4 and 5 and Reference Example 1 were evaluated for the lowest viscosity of adhesive film curing bonding, exudation into cavities and circuit filling by the following methods. The results are shown in Table 4.

The lowest viscosity

The lowest viscosity of the insulation adhesive layers in the multilayer wiring boards were obtained from the results of measurement of visco-elastic modulus of the adhesive films used, in which the adhesive films was heated at the same heating rate as that employed in respective Examples and Comparative Examples. The measurement of visco-elastic modulus was carried out by using MR-500 SOLIQUID METER (produced by Rheology Co., Ltd.)

Exudation into cavities

The resin exudation from the edges of the multi-bonding-deck cavities on the wiring boards A and B were measured in an accuracy of 5 μm by using a microscope of 200 magnification equipped with a video scaler. The exudation at four edges of a multi-bonding-deck cavity on each wiring board were measured, to obtain maximum value, minimum value and average value. 20 cavities were evaluated per one kind of multilayer wiring board.

Circuit filling

A section of each multilayer wiring board was molded with an epoxy resin and then ground. The ground surface was observed with a microscope of 500 magnification for the presence of voids at the sides of copper foil patterns of the internal circuits.

TABLE 4

|  | The lowest viscosity (Pa·s) | Exudation (μm) | | | Circuit filling |
| --- | --- | --- | --- | --- | --- |
|  |  | Maximum | Minimum | Average |  |
| Example 15 | $9.00 \times 10^4$ | 140 | 20 | 82 | No void |
| Example 16 | $4.10 \times 10^4$ | 240 | 85 | 181 | No void |
| Example 17 | $1.00 \times 10^5$ | 120 | 15 | 78 | No void |
| Example 18 | $8.80 \times 10^4$ | 165 | 55 | 119 | No void |
| Comp. Ex. 4 | $1.80 \times 10^4$ | 315 | 215 | 271 | No void |
| Comp. Ex. 5 | $1.00 \times 10^4$ | 445 | 385 | 412 | No void |
| Reference Ex. 1 | $3.00 \times 10^5$ | 95 | 10 | 42 | Some voids |

The adhesive films used in Examples 15 to 18 had the lowest viscosity within the range of $3 \times 10^4$ to $1 \times 10^5$ Pa·s during bonding, and all exhibited the maximum exudation of less than 300 μm and filled the circuits completely. This shows that the method of the present invention is particularly suitable for forming cavities.

The adhesive films used in Comparative Examples 4 and 5 had the lowest viscosity of less than $3 \times 10^4$ Pa·s and their exudation was larger than those used in the above Examples. The adhesive film used in Reference Example 1 had the lowest viscosity of more than $1 \times 10^5$ Pa·s, and exhibited poor circuit filling.

What is claimed is:

1. A multilayer wiring board for mounting a semiconductor device, which has a multi-bonding-deck cavity for housing a semiconductor device and comprises at least two wiring boards each having at least one wiring surface and a cavity, the cavity of one wiring board being larger in size of circumference than the cavity of the other wiring board, the wiring boards being put in layers, with a circumference of the cavity of one wiring board being exterior to a circumference of the cavity of the other wiring board, and bonded to each other with an insulation adhesive layer, the insulation adhesive layer having an elastic modulus of 1,400 MPa or lower as measured at 25° C., having a coefficient of thermal expansion of 450 ppm/° C. or lower in a direction of thickness and being a cured product of an adhesive film which is a semi-cured product of an adhesive composition, the adhesive composition comprising (a) 71 to 100 parts by weight of an epoxy group-containing acrylic rubber which is a copolymerization product of 18 to 40% by weight of acrylonitrile, 2 to 6% by weight of glycidyl acrylate, glycidyl methacrylate or a mixture thereof as a functional group-containing monomer and balance of at least one selected from the group consisting of ethyl acrylate, ethyl methacrylate, butyl acrylate and butyl methacrylate, and has a glass transition point of −10° C. or above and a weight average molecular weight of 100,000 or above, (b) 50 to 70 parts by weight of a combination of an epoxy resin having a weight average molecular weight of less than 10,000 and a curing agent, (c) 10 to 60 parts by weight of a high-molecular weight resin being compatible with the epoxy resin and having a weight average molecular weight of 30,000 or above and (d) 0.1 to 5 parts by weight of a cure accelerator.

2. The multilayer wiring board for mounting a semiconductor device of claim 1, wherein the adhesive composition further comprises 1 to 50 parts by weight of a high-molecular weight resin which is incompatible with the epoxy resin, has a weight average molecular weight of 30,000 or above and is different from the component (a).

3. The multilayer wiring board for mounting a semiconductor device of claim 1, wherein the high-molecular weight resin being compatible with the epoxy resin and having a weight average molecular weight of 30,000 or above is selected from the group consisting of a phenoxy resin, a carboxyl group-containing acrylonitrile-butadiene rubber, a high-molecular weight epoxy resin having a weight average molecular weight of 30,000 to 80,000 and an ultra high-molecular weight epoxy resin having a weight average molecular weight of more than 80,000.

4. The multilayer wiring board for mounting a semiconductor device of claim 1, wherein the high-molecular weight resin being compatible with the epoxy resin and having a weight average molecular weight of 30,000 or above is a phenoxy resin.

5. The multilayer wiring board for mounting a semiconductor device of claim 1, wherein the adhesive composition further comprises 9 to 57% by weight of an inorganic filler based on a total weight of the adhesive composition.

6. The multilayer wiring board for mounting a semiconductor device of claim 1, wherein the adhesive composition further comprises 0.5 to 10 parts by weight of a coupling agent and 0.5 to 10 parts by weight of an inorganic ion adsorbent per 71 to 100 parts by weight of the epoxy group-containing acrylic rubber.

7. The multilayer wiring board for mounting a semiconductor device of claim 1, wherein through holes are made at intervals of less than 2.54 mm, and the insulation adhesive layer has an elastic modulus of 700 MPa or less as measured at 25° C. and a coefficient of thermal expansion of 450 ppm/° C. or less in a direction of thickness.

8. A method of producing a multilayer wiring board for mounting a semiconductor device, comprising forming a laminate composite by putting in layers at least a first wiring board and a second wiring board each having at least one wiring surface and a cavity, the cavity of the first wiring board being larger in size of circumference than the cavity of the second wiring board, with an adhesive film, which has a cavity being identical in size and shape of circumference with the cavity of the first wiring board, disposed between the two wiring boards, so that the circumference of the cavity of the first wiring board is located exterior to the circumference of the cavity of the second wiring board and is located just on the circumference of the cavity of the adhesive film, and bonding the laminate composite with heat and pressure, the adhesive film being a semi-cured product of an adhesive composition comprising (a) 71 to 100 parts by weight of an epoxy group-containing acrylic rubber which is a copolymerization product of 18 to 40% by weight of acrylonitrile, 2 to 6% by weight of glycidyl acrylate, glycidyl methacrylate or a mixture thereof as a functional group-containing monomer and balance of at least one selected from the group consisting of ethyl acrylate, ethyl methacrylate, butyl acrylate and butyl methacrylate, and has a glass transition point of −10° C. or above and a weight average molecular weight of 100,000 or above, (b) 50 to 70 parts by weight of a combination of an epoxy resin having a weight average molecular weight of less than 10,000 and a curing agent, (c) 10 to 60 parts by weight of a high-molecular weight resin being compatible with the epoxy resin and having a weight average molecular weight of 30,000 or above and (d) 0.1 to 5 parts by weight of a cure accelerator.

9. The method of claim 8, wherein during the bonding of the laminate composite with heat and pressure, the adhesive film has a lowermost viscosity of $3 \times 10^4$ to $1 \times 10^5$ Pa·s.

10. The method of claim 9, wherein during the bonding of the laminate composite with heat and pressure, first the laminate composite is heated up to a temperature of 160 to 180° C. at a rate of heating of 5 to 10° C./min, and then heated to 160 to 180° C. for 30 to 120 minutes.

11. The method of claim 9, wherein during the bonding of the laminate composite with heat and pressure, first the laminate composite is heated up to a temperature of 170 to 180° C. at a rate of heating of 5 to 10° C./min at a pressure of 1.0 to 4.0 MPa, and then heated to 170 to 180° C. at a pressure of 1.0 to 4.0 MPa for 30 to 120 minutes.

12. The method of claim 8, wherein the adhesive composition further comprises 1 to 50 parts by weight of a high-molecular weight resin which is incompatible with the epoxy resin, has a weight average molecular weight of 30,000 or above and is different from the component (a).

13. The method of claim 8, wherein the high-molecular weight resin being compatible with the epoxy resin and having a weight average molecular weight of 30,000 or above is selected from the group consisting of a phenoxy resin, a carboxyl group-containing acrylonitrile-butadiene rubber, a high-molecular weight epoxy resin having a weight average molecular weight of 30,000 to 80,000 and an ultra high-molecular weight epoxy resin having a weight average molecular weight of more than 80,000.

14. The method of claim 8, wherein the high-molecular weight resin being compatible with the epoxy resin and having a weight average molecular weight of 30,000 or above is a phenoxy resin.

15. The method of claim 8, wherein the adhesive composition further comprises 9 to 57% by weight of an inorganic filler based on a total weight of the adhesive composition.

16. The method of claim 8, wherein the adhesive composition further comprises 0.5 to 10 parts by weight of a coupling agent and 0.5 to 10 parts by weight of an inorganic ion adsorbent per 71 to 100 parts by weight of the epoxy group-containing acrylic rubber.

17. The method of claim 8, wherein after the bonding of the laminate composite with heat and pressure, through holes are made at intervals of less than 2.54 mm.

18. The multilayer wiring board for mounting a semiconductor device of claim 1, wherein the insulation adhesive layer has an elastic modulus of 700 MPa or less as measured at 25° C.

* * * * *